United States Patent [19]

Chai et al.

[11] Patent Number: 4,578,146
[45] Date of Patent: Mar. 25, 1986

[54] PROCESS FOR GROWING A LARGE SINGLE CRYSTAL FROM MULTIPLE SEED CRYSTALS

[75] Inventors: Bruce H. Chai, Bridgewater; Ernest Buehler, Chatham; John J. Flynn, Millington; Robert C. Morris, Ledgewood, all of N.J.

[73] Assignee: Allied Corporation, Morris Township, Morris County, N.Y.

[21] Appl. No.: 489,450

[22] Filed: Apr. 28, 1983

[51] Int. Cl.[4] ............................................. C30B 7/10
[52] U.S. Cl. .......................... 156/623 R; 156/DIG. 65
[58] Field of Search ................. 156/623 R, 621, 624, 156/DIG. 61, DIG. 65, DIG. 70; 423/311

[56] References Cited

U.S. PATENT DOCUMENTS 4,381,214  4/1984  Christie et al. ............... 156/623 Q
4,382,840  5/1983  Chai et al. ......................... 156/623
4,469,160  9/1984  Giamei ............................ 164/122.1

OTHER PUBLICATIONS

I. R. A. Christie et al., Acta Crystallogr., Sect. A, Suppl. to V. A37, C-142, (1981), "The Fabrication by Joining of Long Seeds for the Growth of Large Synthetic Quartz Crystals".

Primary Examiner—Hiram H. Bernstein
Attorney, Agent, or Firm—James Riesenfeld

[57] ABSTRACT

A large single crystal of metal orthophosphate is grown from a plurality of seed crystals by first mounting the seed crystals with one planar surface of each seed crystal substantially in contact with a planar surface of an adjoining seed crystal and a second planar surface substantially parallel to a second planar surface of the adjoining seed crystal. By known methods, the seeds are then grown into a large single crystal in an acid medium at elevated temperatures. The process is particularly useful for growing large crystals of berlinite, which can then be cut into wafers useful in surface acoustic wave devices.

10 Claims, 10 Drawing Figures

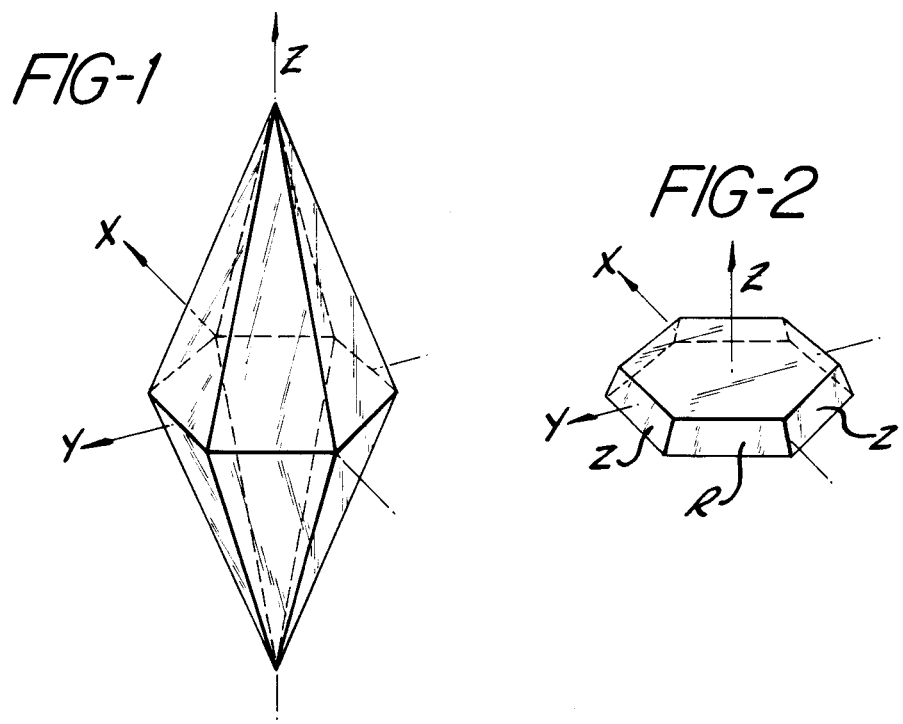
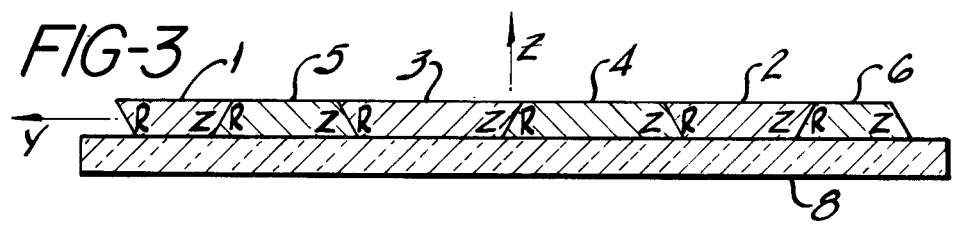
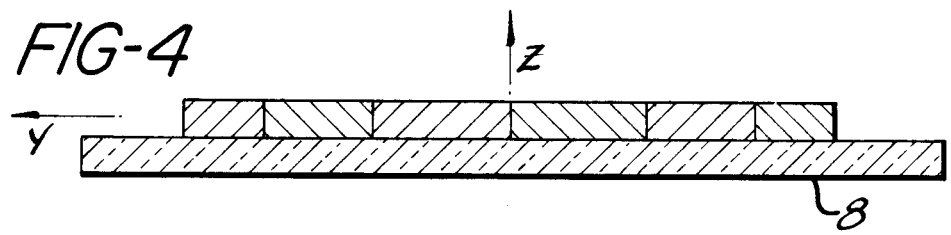
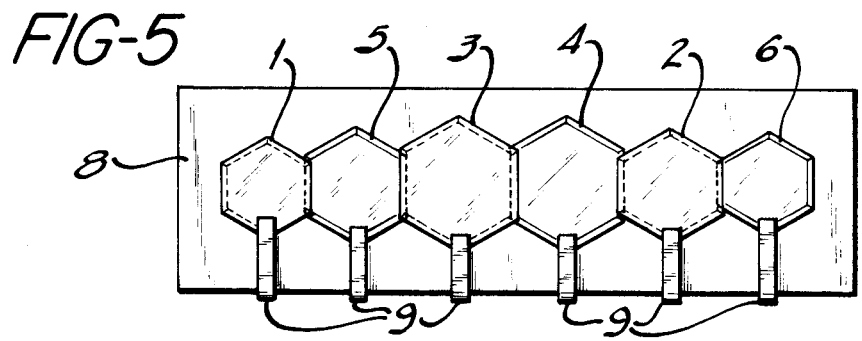

PROCESS FOR GROWING A LARGE SINGLE CRYSTAL FROM MULTIPLE SEED CRYSTALS

DESCRIPTION

BACKGROUND OF THE INVENTION

1. Field of the Invention

This invention relates to a process for growing large single crystals of alpha-aluminum orthophosphate and alpha-gallium orthophosphate.

2. Description of the Prior Art

Alpha-aluminum orthophosphate (berlinite) and alpha-gallium orthophosphate ($GaPO_4$) are among several alpha-quartz isomorphs that have for decades been synthesized for research purposes. An attempt to grow large single crystals of berlinite began after World War II, in an effort to find new piezoelectric crystals for frequency control applications. The project ended a few years later, because success was achieved in quartz crystal growth and because quartz was considered superior for the piezoelectric devices known then. Specifically, it was concluded that berlinite has a lower Q and lower coupling coefficient than quartz. Furthermore, tests on both X and Y cuts of berlinite plates, showing a negative frequency drift with increasing temperature, indicated that there was little chance of finding a zero temperature cut similar to the AT cut of quartz.

Interest in berlinite was renewed in 1976, when Barsch and Chang found that berlinite does have temperature-compensated cuts and that the coupling coefficient for surface acoustic wave (SAW) devices can be four times greater than for quartz.

Several processes for preparing berlinite have been reported in the technical literature (W. Jahn et al., Chem. Erde 16, 75 (1953); J. M. Stanley, Ind. Eng. Chem. 46, 1684 (54); E. D. Kolb et al., J. Crystal Growth 43, 313 (1978)); and L. E. Drafall et al., RADC-TR-80-73, Final Technical Report, March, 1980.

In a typical process, seed crystals are suspended near the bottom of a vertical autoclave and nutrient powder is suspended in a basket at the top. Both seed and nutrient are immersed in concentrated phosphoric acid. In one variation of the process, the temperature is raised slowly from about 150° C. over a period of days. In another variation, a temperature gradient is maintained in the autoclave. In some cases, a gradient is maintained as the temperature is slowly raised.

More recently, U.S. Pat. No. 4,382,840, issued on May 10, 1983, discloses a process and apparatus for growing metal orthophosphate crystals from seed crystals in a horizontally-oriented pressure vessel.

Although most of the processes reported involve growth in phosphoric acid, two recent reports on growth in hydrochloric acid have appeared. Detaint et al., Proc. 34th Symp. on Freq. Control, p. 93 (1980), grew berlinite crystals from powder by increasing the temperature 4° C. per day during hydrothermal growth in HCl. Kolb et al., J. Crystal Growth 51, 178 (1981), achieved higher growth rates in HCl at comparable conditions to those used for $H_3PO_4$ growth. In their method, a temperature gradient of about 1°–3° C. was maintained as the temperature was increased from about 150° C. to about 200° C. or higher at 2°–20° C./day.

A problem that none of the prior art has addressed is that of growing large crystals; i.e., crystals whose longest dimension is at least 150 mm. By prior art processes, growing such large crystals, which are desirable for commercial production of berlinite, would require excessively long periods of time.

SUMMARY OF THE INVENTION

In accordance with the present invention, an improved process is provided for growing a crystal of alpha-aluminum orthophosphate or alpha-gallium orthophosphate from a seed crystal in an acid medium at elevated temperatures.

The improvement comprises growing one crystal from a plurality of seed crystals, each seed crystal having at least two substantially planar surfaces and being mounted so that a first planar surface is substantially in contact with a first planar surface of an adjoining seed crystal along their common length and a second planar surface is substantially parallel to a second planar surface of the adjoining seed crystal.

BRIEF DESCRIPTION OF THE DRAWINGS

FIG. 1 shows a berlinite crystal and the convention for labeling its axes.

FIG. 2 shows a seed crystal cut from the crystal of FIG. 1.

FIG. 3 is a sectional view showing several seed crystals positioned on a plate.

FIG. 4 is a sectional view showing parallel-sided seed crystals positioned on a plate.

FIG. 5 is a plan view of seed crystals mounted on a plate.

DETAILED DESCRIPTION OF THE INVENTION

Figure 6:
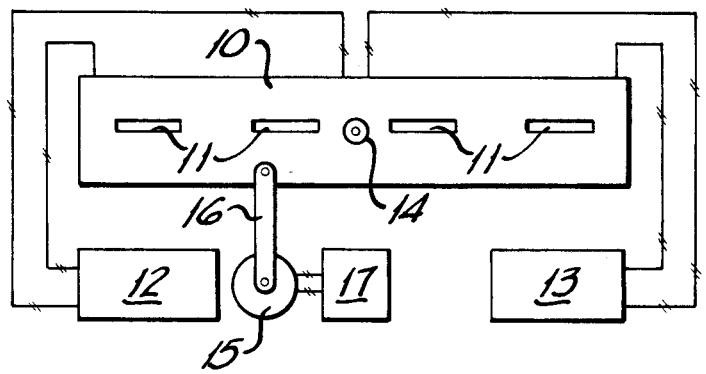
FIG. 6 is a schematic of an apparatus suitable for practicing the process of the present invention.

Berlinite, like quartz, has an $\alpha$-$\beta$ phase transition below the melting temperature. Thus, hydrothermal growth is the preferred process for growing single crystals large enough for practical applications.

Berlinite crystallizes, in the trigonal trapezohedral class of the rhombohedral subsystem. The lattice type is hexagonal. FIG. 1 shows a berlinite crystal and the conventional designation of X- Y- and Z-axes. The Z-direction is the direction of fastest growth, while growth in the Y-direction is very slow. Thus, to grow a crystal in a reasonable time, a seed crystal is cut perpendicular to the Z-axis, as shown in FIG. 2. This cut face is a "non-natural" face, and as deposition on this face occurs, natural faces develop at its edges and eventually take over. When growth in the Z-direction has proceeded to the point where non-natural faces have been eliminated and the peaks of the pyramids (FIG. 1) have been formed, the crystals is said to have "capped out" and the growth rate (now on the natural faces) is drastically reduced. Note that continual cycles of growth from seed crystals prepared as described above can yield successively larger crystals but that the increase in size is limited by the very slow growth in the Y-direction.

The principle that underlies this invention is that a large single crystal of a metal orthophosphate can be grown more readily from several seed crystals, suitably chosen and aligned, than from a single seed crystal. Preferably, the seed crystals are all cut from one single crystal.

There are two alternative ways of preparing and mounting the seed crystals. The easier of the two ways is to slice a berlinite crystal perpendicular to the Z-axis, so that the X- and Y-axes lie in the cut face. The six uncut faces are alternating "R" (major rhomb) and "z" (minor rhomb) faces, as shown in FIG. 2. Preferably, seed crystals are positioned by alternating seeds cut from the top and bottom of the original crystal. The seed crystals are then mounted, as shown in FIG. 3, with a cut face of each pressed against a single flat surface and with major and minor rhomb faces of adjoining seed crystals in contact.

The second way of preparing seed crystals is first to grind the faces of the original crystal to provide faces that are normal to the Y-axis. The seed crystals are then cut, as before, with slices perpendicular to the Z-axis. The resultant seed crystals have parallel faces, perpendicular to the Y-axis. The seed crystals, aligned side-by-side, then have the appearance shown in FIG. 4. An advantage of having seed crystal faces ground as shown in FIG. 4 is that there is no tendency for a seed crystal to be lifted off plate 8 by the growth of an adjoining crystal. A disadvantage of grinding the faces is that a significant amount of material is lost in the process.

Regardless of whether the seed crystals have natural rhomb faces (FIG. 3) or faces ground perpendicular to the Y-axis (FIG. 4), they must be carefully aligned, with the orientation of their axes equal to within $\pm 0.05°$, preferably within $\pm 0.01°$. Otherwise, straincracking results or, for serious misalignment, no junction forms. The seed crystals are preferably mounted on a flat plate 8 with resilient clips 9, as shown in FIG. 5. The numbering of the seed crystals corresponds to their original positions in the crystal, top-to-bottom, before slicing. Plate 8 should be very flat, to permit careful alignment of the seed crystals, and should resist corrosion by the hot acid growth environment. Calcia, alumina, silica glass (e.g., 12% CaO, <18% $Al_2O_3$, >70% $SiO_2$) is a suitable plate material, as is fused silica. Polytetrafluoroethylene (PTFE) is a suitable material for the clips 9, because it combines the requisite corrosion-resistance with suitable mechanical properties.

A large single crystal of a metal orthophosphate may be grown from the plurality of seed crystals by a variety of procedures. The crystal growth procedure and apparatus described below are exemplary. Although the description specifies berlinite (aluminium orthophosphate), the preparation of $GaPO_4$ crystals is identical, except where noted.

A suitable apparatus comprises a substantially cylindrical pressure vessel for containing the materials of the process and means for heating the vessel and maintaining it at a predetermined temperature gradient. The apparatus is described below in some detail. Additional detail appears in U.S. Pat. No. 4,382,840, issued on May 10, 1983, and the disclosure of that patent, to the extent not inconsistent herewith, is incorporated herein by reference.

The pressure vessel is adapted for holding a mixture of hydrochloric acid and phosphoric acid, in which is immersed, in one chamber, the berlinite seed crystals mounted as was described above, and, in one or two adjoining chambers, coarse berlinite crystalline powder (or nutrient). (Of course, when $GaPO_4$ crystals are being grown, the seeds and nutrient are of that material.) The vessel walls are preferably transparent to permit observation of the growth process.

For convenience of loading, unloading, and cleaning the vessel, it is preferably a tube, having a demountable seal at each end. Each seal may comprise an elastomer gasket for mounting between a fluoropolymer plug and the tube. The plug and gasket are preferably resistant to the high temperature and pressure and corrosive environment in the vessel. PTFE is a suitable fluoropolymer and Viton ® is a suitable gasket material.

Each chamber of the vessel is separated from the adjoining chamber(s) by a baffle. The baffle serves to maintain a temperature gradient between the chambers, while, at the same time, permitting liquid to flow between the chambers. Thus, the baffle material is desirably thermally insulating and resistant to the corrosive environment and high temperatures in the pressure vessel.

Preparation of the coarse berlinite powder, or nutrient, that is used in the present process is disclosed and claimed in U.S. Pat. No. 4,324,773, issued Apr. 13, 1982. The preferred particle size for the nutrient is about 20-60 mesh.

The nutrient is introduced into one or more chambers adjoining that which holds the seed crystals. Preferably, the nutrient is contained in a pervious enclosure that permits liquid flow-through while retaining all but the smallest nutrient particles. It is important that small particles of nutrient do not make their way to a growing crystal and become incorporated in it. Orienting the vessel horizontally reduces that possibility.

Hydrochloric and phosphoric acids are introduced into the vessel in an amount to submerge the nutrient and seed crystals. Initial HCl molarity is preferably in the range between about 1-6 M, more preferably about 3-4 M. Reagent grade HCl is suitable. Electronic grade 85% $H_3PO_4$ is commercially available and suitable. Preferably, the initial $H_3PO_4$ molarity is in the range between about 2-7.5 M, with 2-3 M preferred (when $GaPO_4$ is being prepared, higher $H_3PO_4$ molarity, about 3-10 M, is preferred). The sum of HCl and $H_3PO_4$ molarities is preferably about 6-7 (about 8 when $GaPO_4$ is being prepared), with HCl molarity slightly higher. A mixture of 4 M HCl and 2 M $H_3PO_4$ yields the best results. As much acid as possible is introduced into the vessel to maximize the yield; however, if more than 85 percent of the vessel is filled at ambient temperature, then the entire vessel will be filled at about 210° and excessive pressure may develop. Thus, filling the vessel beyond 85% is not recommended.

The heating means may be any of several known in the art. A cylindrical furnace having two independently-controlled resistance heating zones is suitable for achieving the elevated temperature and temperature gradient in the vessel. The temperatures are measured exterior to the vessel, for example using thermocouples, and provide an adequate approximation to the interior temperatures. Temperatures are controlled at the centers of the chambers and may vary by about $\pm 3°$ C. within each chamber. Conventional controllers capable of maintaining control temperatures within about $\pm 1°$ C. of the desired temperatures may be used. If the vessel has three chambers, a three-zone furnace is necessary. The vessel is heated to achieve a seed crystal temperature in the range from about 135° C. to 210° C., with about 170° C. preferred. (A higher temperature range, about 170°-210° C., is preferred for $GaPO_4$ crystal growth, with about 185° C. most preferred.) A gradient is established, so that the nutrient is at a temperature about 5° C. to 30° C. lower than that of the seed crystals, preferably about 10° C. lower. The nutrient should remain above 130° C., where berlinite undergoes a phase change and the solution chemistry is changed. If the temperature of a growing seed crystal is too high, excessive nucleation takes place. If the temperature gradient is too large, excessive nucleation also takes place, and, furthermore, the solution boils in the region of the growing seed crystals. If the temperature is too low, growth is very slow.

With the seed crystals and nutrient immersed in the hydrochloric-phosphoric acid mixture and the elevated temperature and temperature gradient established, the solution at the higher temperature of the seed crystals is super-saturated in berlinite. The berlinite comes out of solution and deposits on the seed crystals, causing them to grow. As the process continues, there is a continual depletion of nutrient in the second chamber and a corresponding growth on the seed crystals.

To enhance the flow of berlinite-enriched solution toward the seed crystals and depleted solution toward the nutrient, the vessel is preferably oriented horizontally and fluid in the vessel is continually flowed between the chambers. This is conveniently accomplished by rocking the vessel about a horizontal axis normal to its cylinder axis. The rocking action is accomplished by methods well known in the art, such as a motor drive. As the vessel is rocked, preferably the nutrient and growing crystals remain submerged. This goal is achieved by using the maximum feasible fill, as discussed above; by not mounting seed crystals or positioning nutrient near the top and ends of the vessel; and by limiting the rocking so that the raised end of the vessel preferably makes with the horizontal an angle of less than 45°, more preferably less than 10°.

By the mechanism described above, and at a rate enhanced by the rocking motion, the berlinite seed crystals grow and join into one crystal. The multipleseed growth process of the present invention provides a faster growth rate than the earlier process, because it takes longer for the growing crystal to "cap out," as described above. Typically, the growth period is about a month. Growth is stopped when the crystal reaches the desired size, or before that if the crystal is capping out or coming into contact with the walls or if the nutrient is nearly depleted. Growth should not continue until the nutrient is depleted, since then the crystal goes into solution.

Because of berlinite's retrograde solubility, there is a tendency for the crystal to go into solution as the vessel is cooled after growth is complete. Consequently, the vessel is cooled rapidly, for example by spraying the vessel with water, until the pressure is reduced to a value at which the vessel may be opened safely. Generally, the vessel may be opened after the temperature is below 100° C.; however, for convenience, the temperature may be further reduced to near ambient temperature. A water spray accomplishes cooling in about 10–15 minutes, after which the crystal can be removed from the solution. If more rapid cooling is attempted, there is a danger that the crystal might crack.

An apparatus suitable for use with the process of the present invention is further described with reference to FIGS. 6, 7, and 8. Where an element of the apparatus appears in more than one Figure, it retains the same reference number in each.

FIG. 6 depicts a schematic of an apparatus suitable for the present process. The pressure vessel is enclosed in a steel jacket, surrounded by a furnace 10. The progress of the crystal growing can be observed through windows 11. Temperatures in the two chambers of the vessel are controlled by temperature controllers 12 and 13. The apparatus is rocked about an axis 14 by motor 15, joined to the vessel through arm 16. Motor speed may be controlled by controller 17.

Figure 7:
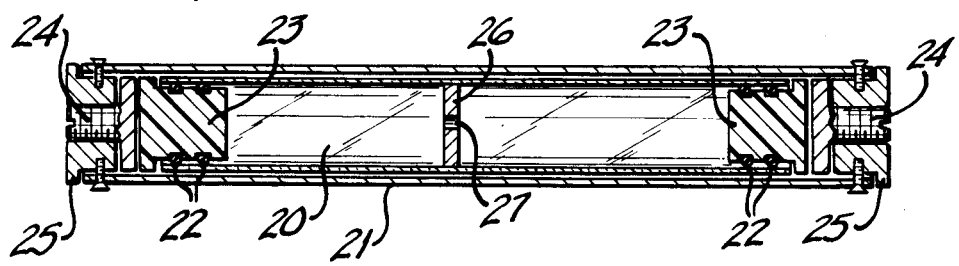
FIG. 7 is a sectional view of a pressure vessel and jacket of a suitable apparatus.

FIG. 7 shows a pressure vessel and jacket of a suitable apparatus in cross section. Pressure vessel 20 is a transparent material, for example fused silica, and jacket 21 may be of steel. Pressure vessel 20 is sealed at its ends by elastomer O-rings 22 and fluoropolymer plugs 23. The plugs 23 are held in place by threaded end caps 24 of jacket plugs 25. The two chambers of the pressure vessel are separated by baffle 26, having through-hole 27.

Figure 8:
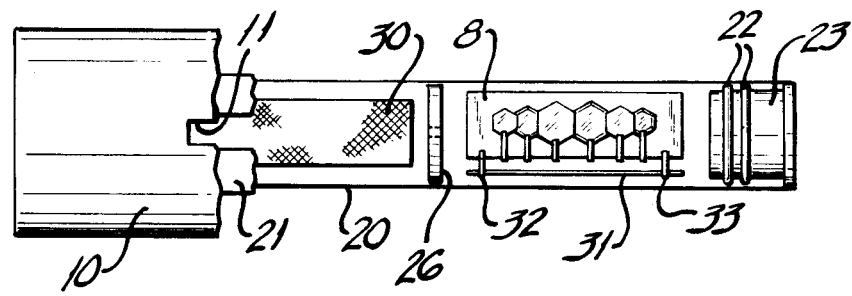
FIG. 8 is a partially cut-away side view of a fully-loaded apparatus.

FIG. 8 shows a cut-away side view of the apparatus loaded with nutrient, in nutrient bag 30, and with seed crystals 1–6. Plate 8 is attached to platinum rod 31 by PTFE clips 32 and 33.

Figure 9:
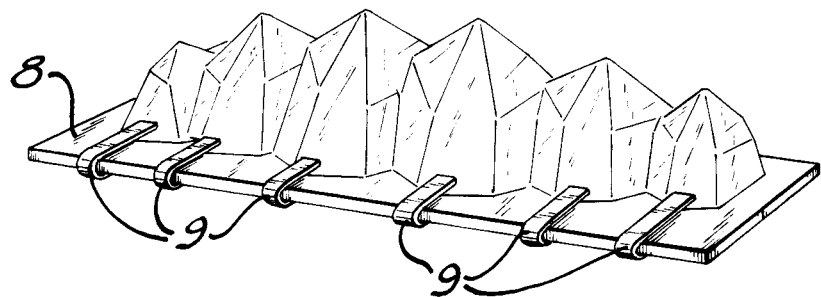
FIG. 9 shows a crystal grown by the process of this invention.

As the growth process proceeds, the seed crystals join to form a single crystal block, as shown in FIG. 9. The crystal is strained at the seed crystal junctions, but, surprisingly, twinning is not a problem, if the seed crystal alignment is accurate.

The crystal shown in FIG. 9 is, in a sense, a "half" crystal, since it extends from a flat base in the +Z-direction only. If a larger crystal is desired, the crystal may be cut perpendicular to the Z-axis (i.e. parallel to flat plate 8) to prepare multiple secondary seed crystals that have a generally rounded rectangular shape. Secondary "whole" crystals may be grown from each of these secondary seed crystals by, for example, using a process and apparatus similar to those described above. The only difference is that seed crystals are suspended in the acid medium and spaced apart, rather than being mounted in contact with each other and with a plate. Thus suspended, the seed crystals grow in both the +Z- and −Z-directions.

Figure 10:
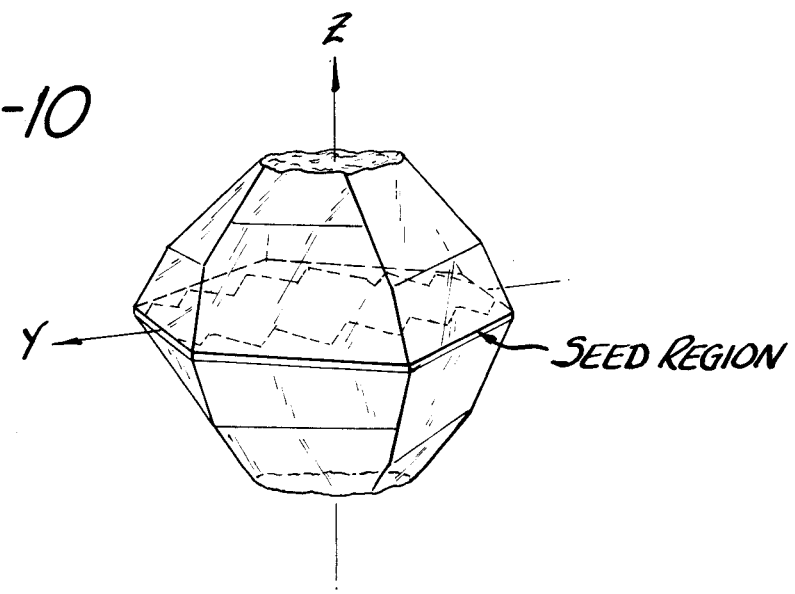
FIG. 10 shows a crystal grown by another process of this invention.

FIG. 10 shows such a secondary whole crystal. Since the whole crystal is about twice the size of the half crystal, it can provide about twice the number of seed crystals, each of which can yield a whole crystal that is about as large as its parent. (In fact, successive generations can each be larger than the parent, because of growth in the X- and Y-directions.) Note that once a crystal is grown whose dimension in the Y-direction is adequate, successive generations of crystals that size can be produced without having to employ the multiple-seed process. Alternatively, if the multiple-seed process is repeated, a very much larger (tertiary) crystal can be grown. In principle, there is no limit to how often the process can be repeated and, consequently, how large the ultimate crystal can be. A practical limit is set by the size of the growth chamber.

We claim:

1. In a hydrothermal process for growing a metal orthophosphate selected from the group consisting of alpha-aluminum orthophosphate and alpha-gallium orthophosphate, in which a crystal is grown from a seed crystal in an acid medium at elevated temperatures, an improvement consisting essentially of growing one crystal from a plurality of seed crystals, each seed crystal having at least two substantially planar surfaces and being mounted so that a first planar surface is substantially in contact with a first planar surface of an adjoining seed crystal along their common length and a second planar surface is substantially parallel to a second planar surface of the adjoining seed crystal.

2. The process of claim 1 in which the seed crystals are all cut from a single crystal of the metal orthophosphate.

3. The process of claim 2 in which the second planar surface of each seed crystal is substantially perpendicular to its Z-axis.

4. The process of claim 2 in which the first planar surfaces on any two adjoining seed crystals are a major rhomb face of one seed crystal and a minor rhomb face of the other.

5. The process of claim 2 in which the first planar surface of each seed crystal is substantially perpendicular to its Y-axis.

6. The process of claim 2 in which the seed crystals are mounted with the second planar surface of each urged against a single flat surface.

7. The process of claim 6 in which the second planar surfaces are urged against a single flat surface by means of resilient clips.

8. The process of claim 7 in which the resilient clips comprise PTFE.

9. The process of claim 1 in which the metal orthophosphate is aluminum orthophosphate.

10. The process of claim 1 further comprising the steps of:
(a) cutting a secondary seed crystal from the crystal grown by the process of claim 1;
(b) growing a secondary crystal from the secondary seed crystal; and
(c) using the secondary crystal as the single crystal in the process of claim 2 to grow a tertiary crystal.

* * * * *